United States Patent [19]
Thornburg

[11] 3,979,586
[45] Sept. 7, 1976

[54] NON-CRYSTALLINE DEVICE MEMORY ARRAY

[75] Inventor: David D. Thornburg, Los Altos, Calif.

[73] Assignee: Xerox Corporation, Stamford, Conn.

[22] Filed: Dec. 9, 1974

[21] Appl. No.: 530,897

[52] U.S. Cl. .............................. 250/209; 250/338; 307/117; 340/173 R
[51] Int. Cl.$^2$ .......................................... H01J 39/12
[58] Field of Search ......... 250/338, 208, 209, 211 J, 250/211 R, 578; 340/173 R, 173 LT; 307/310, 311, 117

[56] References Cited
UNITED STATES PATENTS

| | | | |
|---|---|---|---|
| 3,343,004 | 9/1967 | Ovshinsky | 357/2 X |
| 3,629,863 | 12/1971 | Neale | 340/173 R |
| 3,767,928 | 10/1973 | Bishop et al. | 250/338 |
| 3,801,966 | 4/1974 | Terao | 340/173 LT |
| 3,827,033 | 7/1974 | Quilliam | 340/173 LT |
| 3,846,767 | 11/1974 | Cohen | 340/173 R |
| 3,906,537 | 9/1975 | Thornburg et al. | 357/68 X |

Primary Examiner—Walter Stolwein
Attorney, Agent, or Firm—John E. Beck; Terry J. Anderson; Leonard Zalman

[57] ABSTRACT

An erasable optical memory array having at each storage location a non-crystalline, semiconductor threshold switching device. The threshold voltage of each switching device is strongly temperature dependent and each switching device has a finite recovery time when switched to its low resistance state. Means are provided for periodically sampling each of the switching devices with voltage pulses repetitive at a first frequency and having a first voltage level sufficient to switch to the low resistance state only those switching devices heated above room temperature by a thermal image. Additional means are provided to sample the switching devices at a second frequency greater than the first frequency and at a voltage level less than that of the first voltage level to maintain the switched devices in the low resistance state upon removal of the thermal image.

5 Claims, 5 Drawing Figures

NON-CRYSTALLINE DEVICE MEMORY ARRAY

BACKGROUND OF THE INVENTION

Matrix arrays of bi-stable semiconductor switching elements have been suggested for use as memory devices. Although these elements are potentially inexpensive and capable of integration, they are difficult to organize into a matrix array without requiring additional components to provide gating during the writing and reading cycles. Also, such matrix arrays often have "sneak paths", with reliability only being assured with the incorporation of still additional circuit components.

Matrix arrays have also been used to detect visible images. U.S. Pat. No. 3,767,928 teaches a far infrared image detector comprised of a two-dimensional array of chalcogenide glass thermistor bolometers which change their electrical conductivity as a function of temperature. If an image or pattern of infrared energy is focused on the array, the intensity of the radiation can be determined or reproduced by measuring the resistance of each bolometer of the array. The infrared imaging array of U.S. Pat. No. 3,767,928 does not provide for refreshing of the image or pattern focused thereon and is not capable of utilization as a memory device.

OBJECTS OF THE INVENTION

It is therefore an object of the present invention to provide an improved matrix memory device.

It is a further object of the present invention to provide an improved matrix memory device which avoids "sneak paths".

SUMMARY OF THE INVENTION

In accordance with the invention, a matrix array having rows and columns is provided with each intersection of a row and column defining a storage location. Each storage location comprises a single non-crystalline threshold switching device comprised of a layer of semiconducting glass in contact with at least two spaced metallic electrodes. The glass of the switching device extends beyond the contact surface established with one of the electrodes such that threshold switching is attained.

When an infrared image is focused on the matrix array, certain of the switching devices will heat up and, due to the heating, will switch on during a subsequent raster scan which successively biases each switching device of the matrix array with a signal having a first voltage level which level is less than the initial voltage level required to switch any switching device to its low resistance state at room temperature. The switching yields a binary output signal string during the raster scan which binary signal string can then be used to reconstruct the image on a suitable output device. Since the switching devices require less bias voltage to be retained in their low resistance state than is required to switch them to their low resistance state, the information stored by the array can be refreshed after the removal of the thermal image by biasing the array with refresh voltage pulses having a voltage level less than the first voltage level. Erasure of the stored information is achieved by curtailing the refresh pulses for a time sufficient to allow any heated switching device to "cool" to a point beyond which only the initial voltage level will produce switching.

DETAILED DESCRIPTION OF THE INVENTION

Matrix arrays embodying the invention may have M rows and N columns which are arranged perpendicular to each other in an X-Y grid, where M and N are integers which may or may not be equal. For ease of illustration, the grid of matrix array 2 shown in FIG. 1 has both M and N equal to 5, although larger or smaller grids are contemplated by the invention. Each intersection of a row and a column defines a bit or storage location. Each storage location contains a non-crystalline semiconductor threshold switching device 4 connected between a row conductor 3 and a column conductor 5.

Figure 2:
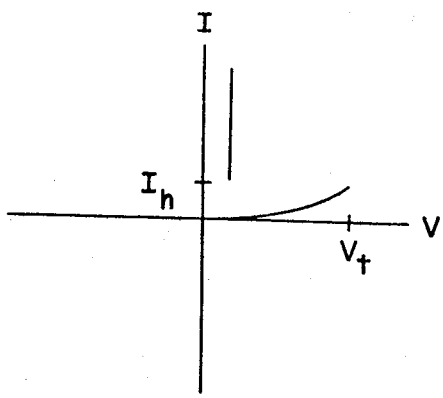
FIGS. 2 and 2a are graphic representations of the threshold switching behavior of the switching devices of FIG. 1.

As shown by FIG. 2, all regions of the V-I curve of the devices 4 are not accessible and, in fact, the V-I characteristic of each device 4 is comprised of regions of two types: a generally high resistance region from the origin to $V_t$ and then an abrupt transition to a low resistance branch of the curve which is not sustained below the current $I_h$.

Each of the storage locations is addressed sequentially by sampling apparatus, shown symbolically as including a pulse source 10 and row and column commutating devices 12 and 14, respectively, which have drive motors 32 and 34, respectively. The low voltage electrode of pulse source 10 is connected through a load resistor 16 to the commutating electrode of commutating device 14. A switching means 15 is provided between the high voltage electrode of pulse source 10 and the commutating electrode of commutating device 12 such that the high voltage electrode of source 10 is connected to the commutating electrode of commutating device 12 directly or through a frequency multiplier 17 and a resistor 18. The drive motors 32 and 34 are controlled by a conventional scan rate control circuit 36 which causes the commutating electrodes of commutating devices 12 and 14 to commutate at a first rate when the source 10 is connected directly to the commutating electrode of commutating device 12 and to commutate at a second, faster rate when the source 10 is connected to the commutating electrode of commutating device 12 through frequency multiplier 17 and resistor 18.

Each of the storage locations is scanned successively, that is, with commutator 14 in its left most position, the commutator 12 samples each of the rows 3 followed by movement of commutator 14 to the next position with commutator 12 repeating its row scan, etc. Thus, a binary output signal string is produced during the raster scan of the matrix array 2. The rate control device 36 regulates the speed of commutation of devices 12 and 14 such that the commutation is synchronized to the pulse rate of source 10 or to the pulse rate of the output of frequency multiplier 17. In this way each device 4 of the matrix 2 is interrogated with one pulse per scan or interrogation, that is, when the scan pulses are supplied to the commutating electrode of device 12 directly from source 10, the scan rate of the commutating electrode of devices 12 and 14 is at a first rate so that each pulse from source 10 interrogates or pulses a device 4, and when the pulses supplied to the commutating electrode of device 12 are from the output of the frequency multiplier 17 (via resistor 18) the scan rate of the commutating electrodes of devices 12 and 14 is at a second rate (which is faster than the first rate) so that each pulse from multiplier 17 interrogates one of the devices 4.

Figure 2A:
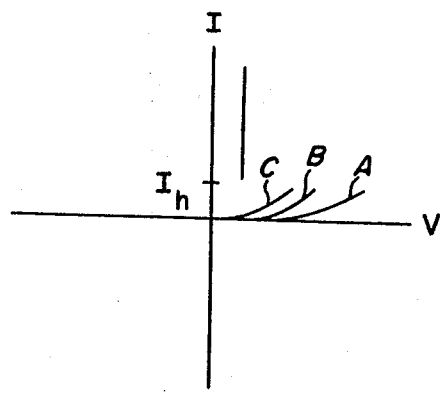

The non-crystalline switching devices 4 are each comprised of a layer of semiconducting material sandwiched between two conductive layers. The switching devices 4 are heat responsive current controlling devices that have a V-I characteristic that is strongly temperature dependent. Referring to FIG. 2a, there is shown the V-I characteristic for a device 4 for different ambient temperatures. Curve A represents the V-I characteristic when a device 4 is at room temperature (300°K), with curves B and C the V-I characteristics at temperatures of 305° and 310°K, respectively. It is thus seen that the threshold voltage required to switch devices 4 to their low resistance state decreases as the temperature of the devices 4 increase in the vicinity of room temperature.

Figure 3:
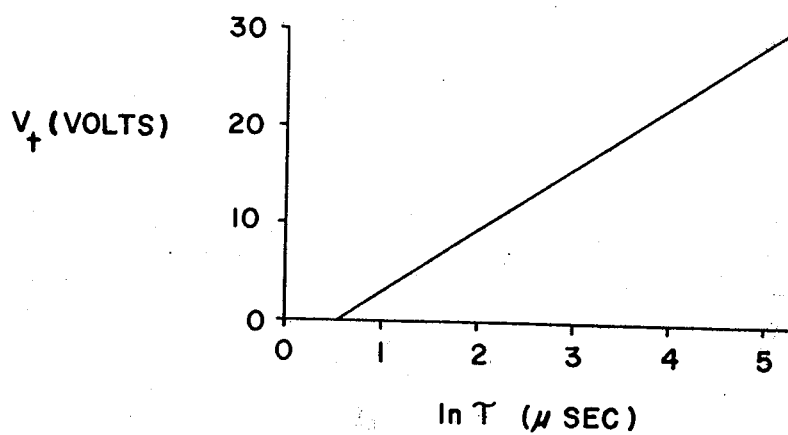
FIG. 3 shows threshold switching voltage as a function of time between successive pulses.

Each device 4 has the further property that it has a finite recovery time, that is, once switched to its low resistance state it exhibits a recovery or persistence phenomenon which allows it to be maintained in its low resistance state by the application of voltage pulses (occurring within a predetermined period) having a magnitude below that needed to switch the devices to their low resistance state. This property is explained in conjunction with FIG. 3 which shows the threshold voltage $V_t$ plotted against ln $\tau$ measured from the time that a device 4 is switched to its low resistance state. As shown, the threshold voltage increases as the time after switching increases. Thus, if a device 4 receives a secondary voltage pulse (is repulsed) shortly after it switches to its low resistance state, it will remain in the low resistance state even though the secondary voltage pulse level or magnitude is substantially below the voltage pulse level required to switch the device to its low resistance state in a presence of a thermal image. If the secondary voltage pulse is delayed, the magnitude of the secondary pulse must be increased with sufficient delay requiring the virgin threshold voltage to achieve reswitching of the device into the low resistance state.

Referring again to FIG. 1, it will now be explained how the strong temperature dependence of the threshold switching devices 4 and the finite recovery time of the threshold switching devices 4 is utilized. The devices 4 of the matrix array 2 are at room temperature and sequentially pulsed at a first rate by pulses from source 10 with switch 15 in its left-most position. The magnitude of the pulses are insufficient to switch any of the devices 4 to its low resistance state when at room temperature. Suppose now that a thermal (infrared) image is focused upon matrix array 2, specifically upon devices 4a and 4b of that array. The thermal image heats devices 4a and 4b to a temperature sufficient to allow the pulses from source 10 to switch them to their low resistance state such that substantial current flows through these devices and the binary output signal string reflects this current flow. Upon removal of the infrared image, the switch 16 is moved to its center position. Now the voltage pulses from the source 10 are applied to the matrix 2 at a faster rate (due to frequency multiplier 17) but at a decreased amplitude (due to resistance 18). Also, the scan rate of the devices 4 is increased due to the scan rate control circuit 36 which scans at an increased rate when the frequency of the input signal thereto increases. Due to the decreased amplitude of the voltage pulses none of the devices 2 not previously switched is turned on by the voltage pulses now received. However, devices 4a and 4b have a finite recovery time and, once switched to the low resistance state by the thermal image and the voltage pulses directly from source 10, these devices can be returned to the low resistance state upon receipt of voltage pulses of less amplitude than those directly from source 10. Thus, the pulses from source 10, and supplied through frequency multiplier 17 and resistor 18, are sufficient to switch devices 4a and 4b to the low resistance state provided that the pulses supplied thereto have a high enough frequency (as provided by the frequency multiplier 17), with increased scan rate of the commutating electrodes provided by circuit 36. Thus, the device of FIG. 1 has memory capability. If it is desired to erase the matrix 2, the switch 16 is moved to its far-right position to interrupt pulses from source 10 for a sufficient time to allow the devices 4a and 4b to become "cold" (achieve room temperature). Thus, in addition to memory, the matrix array 2 has simple erase capabilities.

Figure 4:
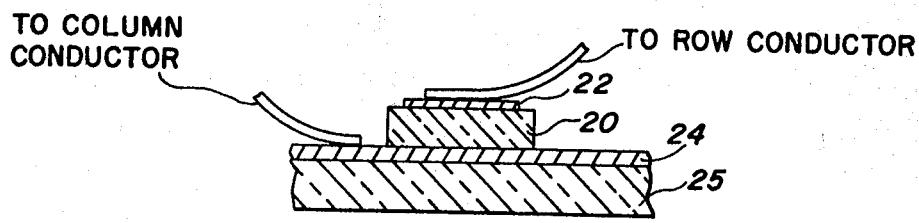
FIG. 4 is a cross-sectional view of an amorphous semiconductor device which exhibits threshold switchings.

The devices 4 are each comprised of a layer of non-crystalline semiconductor material sandwiched between two metallic layers. For example, as shown in FIG. 4, each device 4 may be comprised of a semiconductor layer 20 sandwiched between metallic layers 22 and 24 with insulating layer 25 providing support for layer 24. The layer 22 of each device 4 is coupled to a row conductor 3 and the layer 24 of each device 4 is coupled to a column conductor 5. The layer 22 may consist of a thin (0.25 micron) layer of chromium or aluminum, for example. A suitable material for the layer 24 would be an aluminum layer 0.5 micron thick. As explained, the conductive layers 22 and 24 would serve as the electrode media for the devices 4.

The semiconducting material may consist of, but is not restricted to, the class of amorphous materials known as chalcogenide glasses. Some examples of these, which can be used in the devices described within this preferred embodiment, are alloys consisting of, by atomic fraction, 40% arsenic, 60% tellurium; 40% arsenic, 40% selenium, 20% tellurium; 40% arsenic, 20% selenium, 40% tellurium; 48% tellurium, 30% arsenic, 12% silicon, 10% germanium; and numerous other alloys which would be chosen for their electrical properties and resistance to crystallization. The semiconductor layer 20 may be of any reasonable thickness and in this preferred embodiment would be on the order of one micron. The method of deposition employed in the fabrication of the devices 4 are techniques well known in the art in the deposition of thin films and photolithography of microelectronic circuits. Care must be exercised that the conductive layer 22 is etched such that the semiconductor layer 20 extends beyond the domain defined by the contact area between layer 22 and layer 20, that is, layer 20 extends beyond layer 22 as shown in FIG. 4. An extension of 10 micrometers is sufficient as explained in co-pending U.S. patent application Ser. No. 412,211, filed Nov. 2, 1973, now U.S. Pat. No. 3,906,537.

With devices 4 having the physical parameter specified, the voltage pulses from source 10 preferably have an amplitude of 35 volts when devices 4 are at room temperature (which voltage is insufficient to switch any of the devices 4 to its low resistance state in the absence of a thermal image applied thereto). The frequency or repetition rate of the pulses from source 10 is preferably $10^6$ pulses/sec. The resistor 18 should have a value such that the pulses supplied to commutator 12 when switch 15 is in the middle position have a value of about 30 volts (which is below the voltage level required to switch a device 2 to its low resistance state even though heated by a thermal image incident thereon. With the pulses supplied through resistor 18 being 30 volts, according to FIG. 3, a pulse must be supplied to each switching device each 150 microseconds to provide refreshing of the thermal image, that is, frequency multiplier 16 must supply a signal having a frequency of $2 \times 10^6$ cycles per second when the device 2 is a $5 \times 5$ matrix as shown. Thus, for the example given, the commutation rate doubles when the switch 15 is in the middle position.

Figure 1:
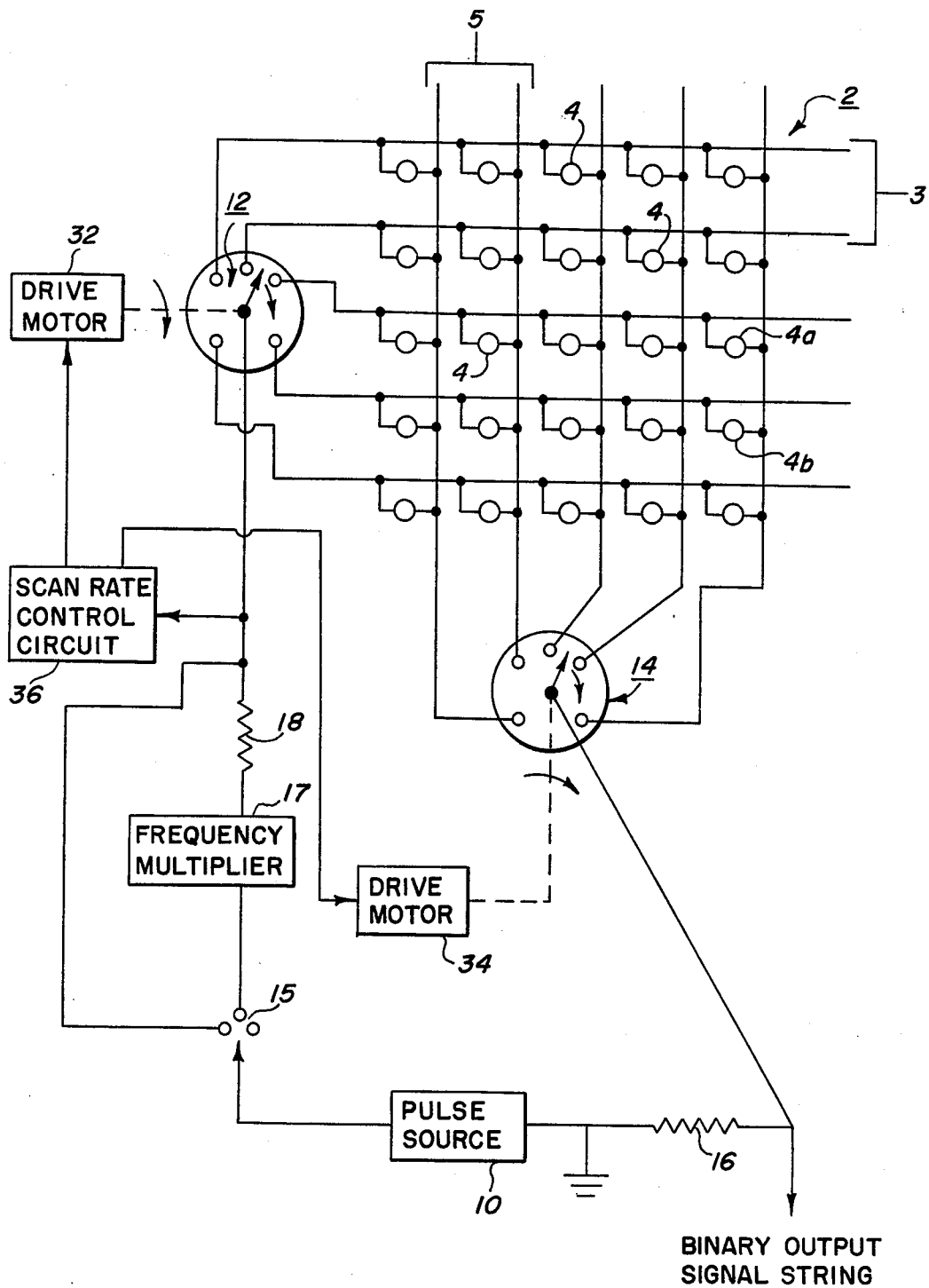
FIG. 1 is a schematic illustration of a memory device in accordance with the invention.

The common problem of "sneak paths" associated with most matrix arrays is avoided in principle by the device of FIG. 1. As an individual switching device 4 is biased, voltages will appear across adjacent switching devices as well. These voltages can be shown to be significantly less than the voltage across a selected device, however, and thus proper biasing can assure that no false signals will be generated by threshold switching devices not directly receiving a thermal image.

In order to have maximum sensitivity, all of the threshold switching devices 4 of the device 2 should have the same cold threshold voltage. This should not present too much of a problem if the image area is kept small. For example, for the device of FIG. 1, the threshold switching devices 4 can have a circular configuration having a diameter of 0.002 inch with adjacent devices spaced on 0.006 inch centers.

Information can be stored in the memory by other than thermal images. For example, selected switching devices can be switched to their low resistance state at room temperature by voltage pulses having a sufficient magnitude. For example, for the type of switching devices specifically enumerated a voltage on the order of 45 volts will switch those devices to their low resistance state at room temperature with refresh being provided by voltage pulses of less mangitude provided that the sampling frequency is sufficiently high.

Although the device of FIG. 1 has been explained in conjunction with mechanical switching devices, electronic switching devices are contemplated by the invention and are actually preferred. Such electronic switching devices are well known in the art and do not per se constitute a part of the invention.

What is claimed is:

1. A memory array comprising a matrix of non-crystalline, semiconductor threshold switching devices each having a V-I characteristic comprised of a high resistance state region and an abrupt transition to a low resistance state region and including means to heat at least a portion of said array,
   first means for switching at least one of said threshold switching devices to its low resistance state,
   second means for sampling each of said threshold switching devices of said matrix with voltage pulses having a magnitude and repetition rate sufficient to maintain said switched threshold switching device in its low resistance state without switching any other of said threshold switching devices to its low resistance state, and
   third means for interrupting said voltage pulses from said second means to allow said switched threshold switching device to revert to its high resistance state.

2. An erasable memory array comprising:
   a matrix of non-crystalline, semiconductor threshold switching devices each having a V-I characteristic comprised of a high resistance state region and a low resistance state region,
   first means for heating at least one of said threshold switching devices,
   second means for repetitively sampling each of said threshold switching devices at a first repetition rate with voltage pulses having a first magnitude sufficient to switch only said heated threshold switching device from its high resistance state to its low resistance state,
   third means for repetitively sampling each of said threshold switching devices at a second repetition rate higher than said first repetition rate with voltage pulses having a magnitude lower than said first magnitude to maintain said switched threshold switching device in its low resistance state without switching any other threshold switching device to its low resistance state, and
   fourth means for interrupting said voltage pulses from said third means for a time sufficient to allow said switching threshold switching device to revert to its high resistance state.

3. A memory array having the combination of:
   a matrix of non-crystalline, semiconductor threshold switching devices each having a V-I characteristic comprised of a high resistance state region and an abrupt transition to a low resistance state region,
   first means for heating at least one of said threshold switching devices of said matrix,
   second means for repetitively sampling at a first repetition rate each of said threshold switching devices of said matrix with voltage pulses having a first mangitude sufficient to switch only said heated threshold switching device from its high resistance state to its low resistance state, and
   third means for increasing the repetition rate and decreasing the magnitude of said sampling pulses after said heated threshold switching device has switched to its low resistance state to thereby maintain said switched threshold switching device in its low resistance state without switching any other threshold switching device to its low resistance state.

4. A memory array having the combination of:
   a matrix of non-crystalline, semiconductor threshold switching devices each having a V-I characteristic comprised of a high resistance state and a low resistance state,
   first means for heating at least one of said threshold switching devices of said matrix,
   second means for supplying voltage pulses having a given frequency and a given amplitude,
   third means coupled to said matrix and said second means for sequentially applying one of said voltage pulses across each of said threshold switching devices of said matrix while said at least one threshold switching device is being heated, the amplitude of said voltage pulses being sufficient to switch said heated threshold switching device to its low resistance state, fourth means coupled to said third means and said second means for both increasing the frequency of said voltage pulses applied to said threshold switching devices and for decreasing the amplitude of said voltage pulses so as to maintain said switched threshold switching device in its low resistance state without switching any other of said threshold switching devices to its low resistance state, fifth means coupled to said second means for allowing said switched threshold switching devices of said matrix to revert to its high resistance state, and sixth means coupled to said matrix for providing a binary output signal string indicative of the resistance state of the devices of said matrix.

5. The memory array of claim 4 wherein said fourth means comprises a switching device, a frequency multiplier circuit, and a resistance device.

* * * * *